United States Patent [19]

Amin

[11] Patent Number: 4,556,806

[45] Date of Patent: Dec. 3, 1985

[54] GATE ALTERABLE OUTPUT BUFFER

[75] Inventor: Pravin T. Amin, Houston, Tex.

[73] Assignee: Texas Instruments Incorporated, Dallas, Tex.

[21] Appl. No.: 673,823

[22] Filed: Nov. 21, 1984

Related U.S. Application Data

[63] Continuation of Ser. No. 376,319, May 10, 1982.

[51] Int. Cl.$^4$ ................ H03K 19/094; H03K 17/687
[52] U.S. Cl. .................................. 307/475; 307/584; 307/578; 364/900
[58] Field of Search .............. 307/557, 465, 468, 239, 307/260, 475, 270, 448, 584; 364/200 MS File, 900 MS File, 709, 710; 328/160, 158, 172, 112

[56] References Cited

U.S. PATENT DOCUMENTS

| | | | |
|---|---|---|---|
| 4,040,033 | 8/1977 | Strutynski | 364/200 |
| 4,131,940 | 12/1978 | Moyer | 364/200 |
| 4,435,763 | 3/1984 | Bellay et al. | 364/200 |
| 4,481,432 | 11/1984 | Davies, Jr. | 307/469 |

Primary Examiner—Eddie P. Chan
Attorney, Agent, or Firm—Robert D. Marshall; N. Rhys Merrett; Melvin Sharp

[57] ABSTRACT

An electronic output buffer includes an inverter connected to an input line with several circuit devices for driving an output. The buffer further includes the programmable capability at manufacture for selecting one of several buffer configurations by selectively connecting the inverter and the input line to the circuit driving devices and by selectively connecting the circuit driving devices to one of at least two voltage sources.

10 Claims, 10 Drawing Figures

SECTION AA

GATE ALTERABLE OUTPUT BUFFER

This is a continuation, of application Ser. No. 376,319, filed May 10, 1982.

BACKGROUND

1. Field of the Invention

This invention relates to output buffers and more specifically to metal oxide silicon field effect transistor-driven output buffers. 2. Description of the Prior Art Digital circuitry has often required output buffers to drive output signals from digital logic to other peripheral devices. There are three basic types of output circuits: (a) push-pull; (b) pull-high; and (c) pull-low. The push-pull buffer amplifier is illustrated in FIG. 1a. This circuit receives an input 1 and converts this input 1 into two signals, gate line 11 into device 9 and line 2 which is inputted into inverter 3 which in turn is inputted to device 6. Devices 9 and 6 are metal oxide silicon field effect transistors which when turned on, allow the connected power supply to drive the output line 8 to the output pad 7 which is outputted to the external peripheral device. Therefore if the input is low, which turns on device 9 via gate line 11, the plus voltage at 10 drives the output pad 7 via line 8. If there was a high input on line 1, then line 2 will have a high input to the inverter 3 which will have a low input on line 4 to the gate of device 6, thus turning on device 6 and driving the output pad 7 via output line 8 from the negative power supply 5. If the input on line 1 is low, there will be a plus voltage on the output pad 7 and if the input line 1 is high, there will be a negative voltage on the output pad 7. In addition to inverter 3 driving the gate of device 6, FIG. 1a illustrates a gated capacitor 13 which supplements the charge on line 4 to the gate of device 6 via line 12. The gated capacitor is a device used to provide the supplmental charge in order to decrease the voltage drop across a P channel MOS field effect transistor 6 when transferring a negative signal. The use of the gated capacitor is referred to as "boot-strapping" and is discussed in greater detail in U.S. patent application Ser. No. 335,028 entitled, "Low Power Circuit for Microcomputer", by Jerald Leach and assigned to Texas Instruments.

The second type of buffer configuration is the pull-high configuration. The schematic for this configuration is illustrated in FIG. 1b. The pull-high configuration merely allows a low signal on line 1 to turn on device 9 via line 11, thus allowing a positive voltage to be placed on the output pad 7 through output line 8. While line 2 still feeds an inverter 3, the inverter 3 is not connected to device 6, thus there is either a positive voltage on the output pad 7 when a low input is received or there is no voltage on the output pad when a high input is received.

The pull-down configuration is illustrated in FIG. 1c. A high inputted on line 1 is input into inverter 3 via line 2 thus causing device 6 to turn on and place the negative voltage 5 through output line 8 onto the output pad 7. Note that the gated capacitor 13 is connected as previously discussed. Device 9 which in the push-pull configuration is used to supply the positive voltage to the output pad is incomplete. The gate is not fabricated. Therefore when an input is low, the output pad 7 receives no voltage; however, when the input pad is high, the negative power supply 5 is output to the pad 7. This type of configuration is used for "active low" type of output drive requirements.

The output buffers discussed above are common output insulated gate field effect transistor (IGFET) buffers and are illustrated in U.S. Pat. No. 3,991,305 entitled, "Electronic Calculator or Digital Processor Chip With Multiple Code Combinations of Display and Keyboard Outputs Scan", by Caudel et al, assigned to Texas Instruments. An advancement in modern microcomputer output buffer architecture is illustrated by U.S. patent application Ser. No. 253,957 (TI8841) entitled, "Multiprogrammalbe Input/Output Circuitry", by Jeffrey Bellay et al, now U.S. Pat. No. 4,435763 assigned to Texas Instruments.

It is customary when a user specifies the output buffer for a IGFET logic circuit, the user will specify one of the three buffer configurations. It is common practice to manufacture output buffers for the push-pull configuration and then simply omit the gates of the specified devices to allow either a pull-high or a pull-low output buffer in fabrication as shown in FIGS. 1b and 1c. While this option satisfies the customer desiring a pull-high or pull-low output buffer configuration, a IGFET driving device is wasted. This is illustrated in FIG. 1d which illustrates the actual IGFET layout of the push-pull amplifier in FIG. 1a. Note that the input 1 is received as before and is connected to device 9 which is a IGFET device including a source 15, a drain 17, a metal gate 18 placed over an oxide region 16. When the input signal 1 is low, the gate is turned on by line 11 thus causing the device 9 to conduct the positive current at node 10 to the output pad 7 via line 8 as previously discussed. Likewise, when the input is high, the input to inverter 3 is high on line 2. A low signal is outputted from inverter 3 on line 4 to device 6. Device 6 comprises the source 22, drain 19 and the gate region 21 is over the oxide region 20. The drain 22 is connected to the negative power supply 5. When line 4 is low (i.e., the input 1 is high) gate 21 turns on. The charge on gate 21 is supplmented by a gated capacitor 13 via line 12. The gated capacitor receives an input from a clock O 42 which is connected to diffusion 24 and is capacitively coupled to a metal region 23 which is connected by line 12 to gate 21. Thus when gate 21 turns on the device 6, the power supply 5 is connected to the output pad 7 via line 8. When the customer desires a pull-high output buffer, the gate oxide 20 is not fabricated. Thus the device 6 which is present on the semiconductor substrate is unused and wasted. Likewise when the customer specifies a pull-low output buffer configuration, device 9 is effectively disabled by not fabricating the gate oxide region 16. The silicon area occupied by device 9 is then wasted.

It is an object of this invention to allow for the alterations of the buffer configurations to utilize both current driving devices.

SUMMARY

In accordance with the present invention, an electronic output buffer is disclosed which includes an inverter connected to an input line and several circuit devices for driving an output line. Further included is the capability programmable in manufacture for realizing one of several buffer configurations by the selective connection of the inverter and the input line to the circuit devices and the selective connection of the circuit devices to one of several voltage sources.

In a preferred embodiment, an electronic output buffer is disclosed that includes an inverter, two MOSFET driving devices, two gated capacitors and a switching means, programmable at manufacture, to provide one of three possible buffer configurations. The three possible buffer configurations include the push-pull, pull-high and pull-low configurations. In the the push-pull configuration, the input line is directly connected to one of the gates of the transistors. This first transistor has a source connected to one of the two voltage supplies. The drain of the transistor is connected to an output line and is also connected to the source of the second transistor. The gate of the second transistor is connected to the output of the inverter. The input to the inverter is connected to the input line. The gate of the second device is additionally connected to a gated capacitor which provides a boot-strap voltage to the gate. The drain of the second transistor is connected to the second voltage supply. This push-pull configuration will drive the output line to a positive voltage when the input signal is low or to a negative voltage when the input signal is high. The second buffer configuration is the pull-high configuration. In this configuration, the input is tied directly to both gates of both transistors. The source of one transistor is tied to the positive voltage supply and the drain of the other transistor is also tied to the positive voltage supply. The drain of the first transistor and the source of the second transistor are tied to the output line. When the input is low, the output line is driven by both the transistor devices. The third buffer configuration is the pull-low configuration. In this configuration the input line is tied to the inverter and the output of the inverter is tied to both the gates of the two transistor devices. In addition the gates are connected to gated capacitors which provide a boot-strap voltage. The first transistor device has the source tied to a negative voltage supply and its drain tied to the output line. The second transistor has its drain tied to the negative voltage supply and its source tied to the output line. Therefore, when the input is high, the buffer becomes active with both transistors driving the output line.

BRIEF DESCRIPTION OF THE DRAWINGS

The features of this invention are described in detail in the claims. Features of this invention can be best understood by reading the detailed description of the invention with reference to the accompanying figures wherein:

FIG. 1d is a diagram illustrating the layout of the transistor devices for the output buffer configuration in FIG. 1a.

FIG. 3b is a side sectional view of the substrate in FIG. 3a.

DESCRIPTION OF THE INVENTION

As discussed in the background, the use of the three different output buffer configurations can result in the waste of MOSFET devices on the silicon substrate. This invention solves this problem by allowing both MOSFET current driving devices to be used in all three of the output buffer configurations.

Figure 2B:
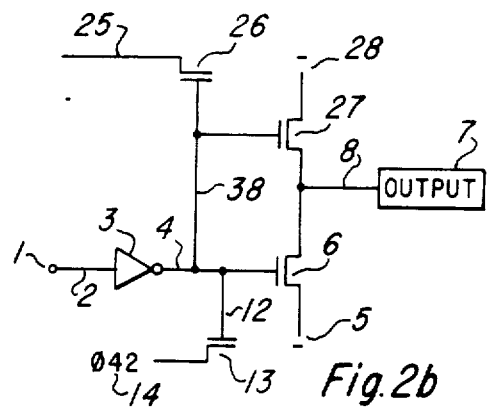
FIG. 2b is a schematic diagram of the pull-low output buffer configuration utilizing this invention.
Figure 1D:
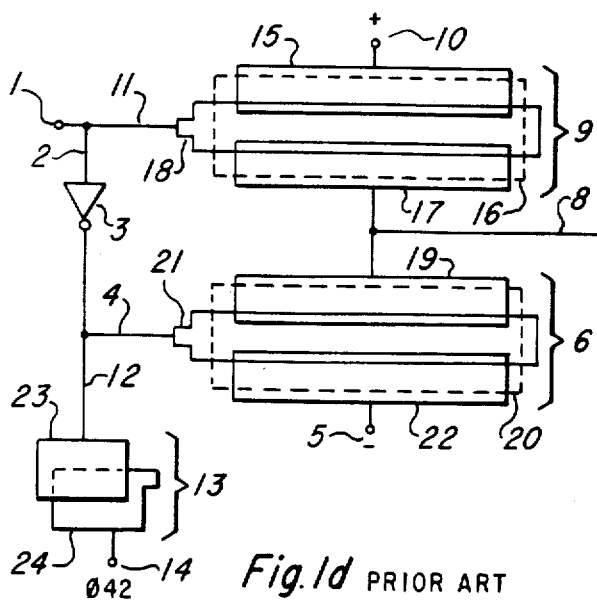
Figure 2D:
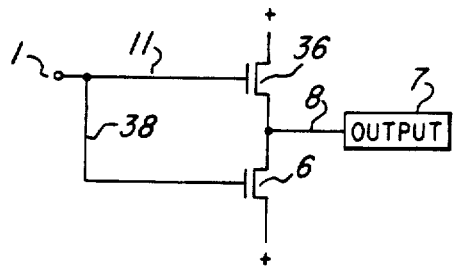
FIG. 2d is a schematic illustrating the invention configurated as the pull-high output buffer configuation.
Figure 2A:
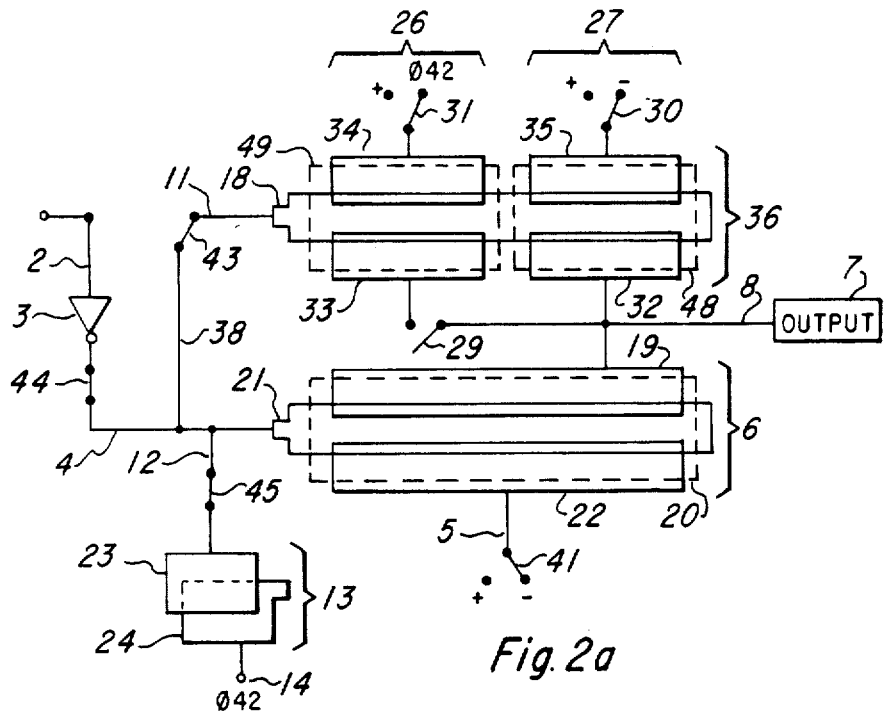
FIG. 2a is an illustration of device layout of the invention.

FIG. 2a illustrates one embodiment of the invention. Note that the device layout in FIG. 2a is similar to the device layout in the prior art of FIG. 1d, except for the device 36 which is substantially different than device 9, together with a number of alterable connections such as 29, 30, 31 41, 43, 44 and 45. The layout in FIG. 2a is configured as a pull-low output buffer. Note that the input 1 is coupled to inverter 3 via line 2 and line 4 now couples the output of inverter 3 through alterable line 44 to both gates 18 and 21 of the output buffer. The signal coupled to gate 21 is similar to the signal that is coupled into gate 21 of device 6 in FIG. 1d. The signal at gate 21 has its charge supplemented by the gated capacitor 13 which includes a metal plate 23 capacitively coupled to a diffusion 24 which is connected to a clock signal O 42. The drain 22 of device 6 is connected to the negative power supply by line 5. The source 19 of device 6 is connected to line 8 to output pad 7. Device 36, however, actually includes two separate devices. In device 36 the source and drain areas are divided into two separate parts. Source 34 and 35 actually define two separate devices. Source 34 is a diffusion that is connected by alterable line 31 to O 42, thus making device 34 a diffusion that is capacitively coupled to a metal gate 18 forming the gated capacitor. The gate oxide regions 48 and 49 are fabricated to provide for the independent operation of devices 26 and 27 (i.e., the channel from source 35 to drain 32 is isolated from the channel from source 34 to drain 33). Source 35 is connected by alterable line 30 to the negative power supply and the drain 32 is connected to the output line 8 to output pad 7. The gate for device 18 is connected to line 11 and by alterable line 43 and line 38 to the output of inverter 3. Therefore the resulting circuit shown in schematic form in FIG. 2b is a pull-low buffer configuration with two driving transistors 6 and 27 with gated capacitors 13 and 26.

Figure 1A:
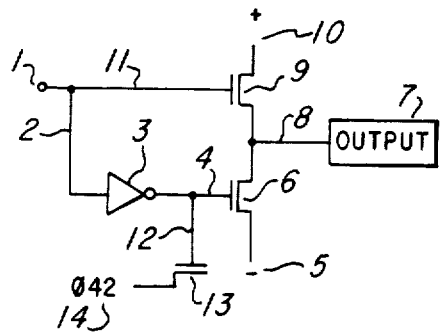
FIG. 1a is a schematic diagram of the prior art push-pull output buffer configuration.
Figure 1B:
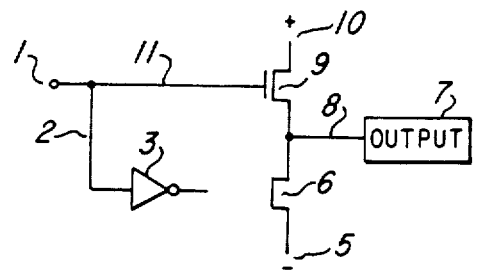
FIG. 1b is a schematic diagram of the prior art pull-high output buffer configuration.
Figure 1C:
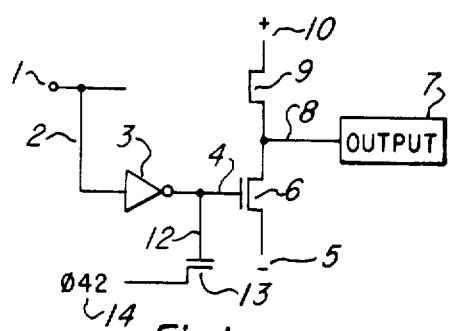
FIG. 1c is a schematic diagram of the prior art pull-low output buffer configuration.

By changing the alterable lines 29, 30, 31, 41, 43, 44 and 45, the push-pull amplifier illustrated in FIG. 1d and schematically in FIG. 1a can be achieved. By connecting alterable line 30 to the positive power supply and alterable line 31 to the positive power supply and connecting alterable line 29 such that drain 33 and drain 32 are both connected to output line 7, device 36 now becomes the current driving device connected to the positive power supply. Likewise device 6 is still the current driving device that is connected to the negative power supply by having alterable line 41 properly connected. By altering line 43 such that line 11 now connects to the input 1, the input 1 is then connect directly to device 36 and through an inverter 3 to device 6 similar to the circuit shown in FIG. 1d. Thus with a minimal change in alterable lines, two separate output configurations can be achieved where both output configurations utilize the two current driving devices.

Figure 2C:
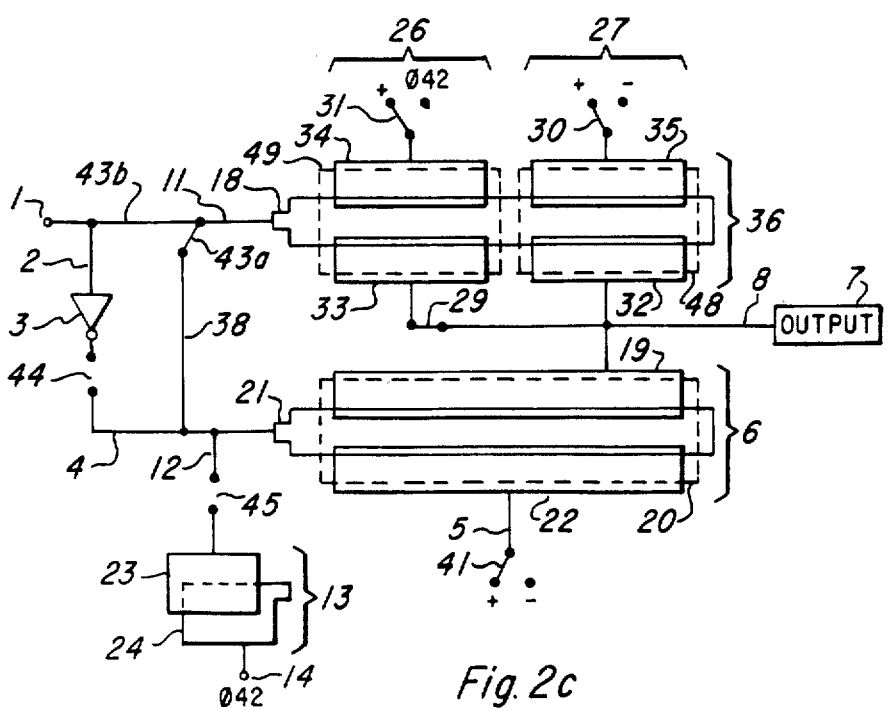
FIG. 2c illustrates the device layout with this invention configured in the pull-high buffer configuration.

A second embodiment is illustrated in FIGS. 2c and 2d. In this embodiment the layout can be altered to include the pull-high output buffer. In this configuration, the input 1 is connected to gates 21 and 18 directly via lines 11, alterable lines 43a and 43b and line 38. The inverter 3 is switched out of the circuit by alterable line 44. Likewise, the gated capacitor 13 is switched out of the circuit by alterable line 45 since it is not required to supplement the charge of the gate 21. Alterable lines 30 and 31 are fabricated such that the source areas 34 and 35 are both connected to the positive power supply. Alterable line 29 is fabricated such that the two drains 32 and 33 are connected to output line 8. Alterable line 41 is connected to the positive power supply such that the drain 22 is now connected to the positive power supply. The schematic for this configuration is illustration in FIG. 2d. Thus both current driving devices 6 and 36 are now connected to positive power supplies and are switched on directly by the input 1 via lines 11 and 38.

It should be noted that the gated capacitors used in these circuits are interchangeable between the two devices in accordance with the type of devices in use. The devices illustrated in the preferred embodiments are P channel devices, thus the gated capacitors were needed to supplement charge when driving a negative power supply to the output pad. If the devices were fabricated as N channel devices, the N channel devices utilize gated capacitors in driving the positive power supply to the output pad.

Another advantage of this invention results from the fact that two current driving devices now exist for all three buffer configurations, thus making it possible to have a higher current rating for the pull-low and pull-high output configurations. In a similiar manner, the devices' size on the substrate may be reduced since the two devices are combined for the pull-low or pull-high configurations. This assumes that the smaller area for the single devices provide a satisfactory current drive for the push-pull output buffer configuration.

Alterable lines are fabricated by programmable contacts in which contacts are connected to diffusions in a manner similiar to gate fabrication. In addition some alterable lines or connections can be achieved by selectively fabricating gates for the inverter 3 or gated capacitor 13. By omitting the gate from the inverter 3 or gated capacitor 13, the inverter 3 and gated capacitor 13 will be disconnected from the circuit. Since the alterable lines are fabricated during the gate mask stage of semiconductor fabrication, the alterable line feature does not require any additional fabrication steps.

Figure 3A:
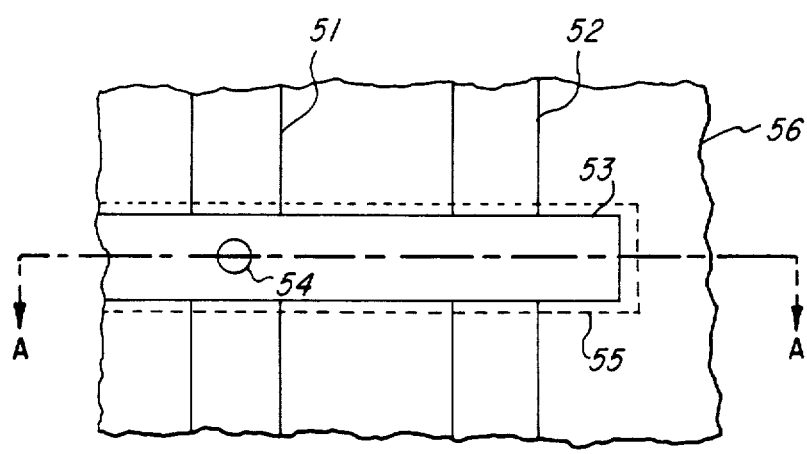
FIG. 3a is a top view of a semiconductor substrate containing two diffusions and a metal line.
Figure 3B:
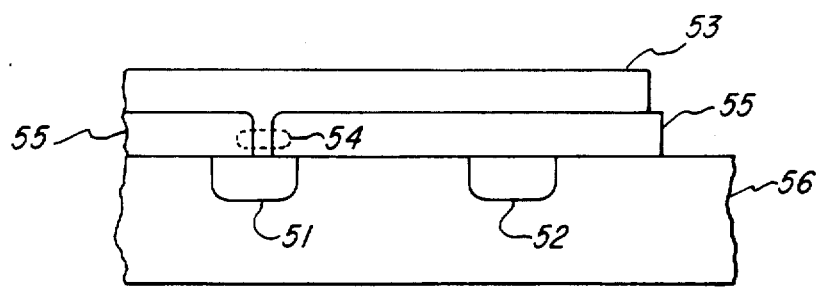

FIGS. 3a and 3b illustrate alterable line fabrication. FIG. 3a is a top view of a semiconductor substrate 56 with two diffusions 51 and 52. A metal line 53 is fabricated above and across the two diffusions 51 and 52. A contact 54 has been fabricated to connect metal line 53 to diffusion 51 through the field oxide layer 55. There is no contact between metal line 53 and diffusion 52. The contact 54 is programmable at manufacture and connects metal line 53 to diffusion 51 if desired.

FIG. 3b illustrates a section side view of the configuration in FIG. 3a. The metal line 53 is separated by a field oxide layer 55. During fabrication of the gates for the device, the field oxide layer 55 is etched and the opening 54 is fabricated. When the metal line 53 is deposited, contact is made with diffusion 51. Line 53 is insulated from diffusion 52 by the field oxide 55.

What we claim is:

1. An electronic output buffer comprising:
   an input terminal for receiving signals;
   an output terminal;
   a clock signal terminal for receiving clock signals;
   a power supply means having a first power terminal for supplying electric power having a first polarity and a second power terminal for supplying electric power having a second polarity opposite to said first polarity;
   an inverting means having an inverter input terminal connected to said input terminal and an inverter output terminal;
   a first field effect device (26) having a first source, a first gate and a first drain;
   a second field effect device (27) having a second source, a second gate connected to said first gate and a second drain connected to said output terminal;
   a third field effect device (6) having a third source connected to said output terminal, a third gate and a third drain;
   a first connection means (31) selectable in manufacture for connecting said first source to either said first power terminal or said clock signal terminal;
   a second connection means (30) selectable in manufacture for connecting said second source to either said first power terminal or said second power terminal;
   a third connection means (29) selectable in manufacture for connecting or disconnecting said first drain to said output terminal;
   a fourth connection means (43a) selectable in manufacture for connecting or disconnecting said first gate to said third gate;
   a fifth connection means (43b) selectable in manufacture for connecting or disconnecting said first gate to said input terminal;
   a sixth connection means (41) selectable in manufacture for connecting said third drain to either said first power terminal or said second power terminal; and
   a seventh connection means (44) selectable in manufacture for connecting or disconnecting said inverter output terminal to said third gate
   whereby the electronic output buffer is configurated to operate as a push-pull, pull low or pull high output buffer by the connection thereto with the first, second and third field effect device.

2. An electronic output buffer as claimed in claim 1, wherein:
   said first connection means (31) connects said first source to said first power terminal;
   said second connection means (30) connects said second source to said first power terminal;
   said third connection means (29) connects said first drain to said output terminal;
   said fourth connection means (43a) does not connect said first gate to said third gate;
   said fifth connection means (43b) connects said first gate to said input terminal;
   said sixth connection means (41) connects said third drain to said second power terminal; and
   said seventh connection means (44) connects said inverter output terminal to said third gate;
   whereby said electronic output buffer operates as a push-pull output buffer.

3. An electronic output buffer as claimed in claim 2, further comprising:
   a gated capacitor having a first capacitor terminal connected to said clock signal terminal and a second capacitor terminal;

a eighth connection means selectable in manufacture for connecting or disconnecting said second capacitor terminal to said third gate.

4. An electronic output buffer as claimed in claim 3, wherein:
said eight connection means connects said second capacitor terminal to said third gate.

5. An electronic output buffer as claimed in claim 1, wherein:
said first connection means (31) connects said first source to said clock signal terminal;
said second connection means (30) connects said second source to said second power terminal;
said third connection means (29) does not connect said first drain to said output terminal;
said fourth connection means (43a) connects said first gate to said third gate;
said fifth connection means (43b) does not connect said first gate to said input terminal;
said sixth connection means (41) connects said third drain to said second power terminal; and
said seventh connection means (44) connects said inverter output terminal to said third gate;
whereby said electronic output buffer operates as a pull low output buffer.

6. An electronic output buffer as claimed in claim 5, further comprising:
a gated capacitor having a first capacitor terminal connected to said clock signal terminal and a second capacitor terminal;
a eighth connection means selectable in manufacture for connecting or disconnecting said second capacitor terminal to said third gate.

7. An electronic output buffer as claimed in claim 6, wherein: said eight connection means connects said second capacitor terminal to said third gate.

8. A electronic output buffer as claimed in claim 1, wherein:
said first connection means (31) connects said first source to said first power terminal;
said second connection means (30) connects said second source to said first power terminal;
said third connection means (29) connects said first drain to said output terminal;
said fourth connection means (43a) connects said first gate to said third gate;
said fifth connection means (43b) connects said first gate to said input terminal;
said sixth connection means (41) connects said third drain to said first power terminal; and
said seventh connection means (44) does not connect said inverter output terminal to said third gate;
whereby said electronic output buffer operates as a pull high output buffer.

9. An electronic output buffer as claimed in claim 2, further comprising:
a gated capacitor having a first capacitor terminal connected to said clock signal terminal and a second capacitor terminal;
a eighth connection means selectable in manufacture for connecting or disconnecting said second capacitor terminal to said third gate.

10. An electronic output buffer as claimed in claim 3, wherein:
said eight connection means connects said second capacitor terminal to said third gate.

* * * * *